United States Patent [19]

Buzak

[11] Patent Number: 5,077,553
[45] Date of Patent: Dec. 31, 1991

[54] APPARATUS FOR AND METHODS OF ADDRESSING DATA STORAGE ELEMENTS

[75] Inventor: Thomas S. Buzak, Beaverton, Oreg.

[73] Assignee: Tektronix, Inc., Beaverton, Oreg.

[21] Appl. No.: 434,634

[22] Filed: Nov. 13, 1989

Related U.S. Application Data

[63] Continuation of Ser. No. 145,061, Jan. 19, 1988, abandoned.

[51] Int. Cl.$^5$ ............................................. G09G 3/00
[52] U.S. Cl. .................................... 340/794; 340/771
[58] Field of Search ............... 340/713, 714, 758, 771, 340/794, 793, 767, 716, 718, 719, 765, 784; 315/108, 116, 106

[56] References Cited

U.S. PATENT DOCUMENTS

| | | | |
|---|---|---|---|
| 3,634,719 | 1/1972 | Ernsthausen | 365/116 |
| 3,821,748 | 6/1974 | Brown | 365/116 |
| 3,904,915 | 9/1975 | Hinson | 340/771 |
| 3,972,040 | 7/1976 | Hilsum et al. | |
| 4,027,195 | 5/1977 | Shutoh et al. | 340/771 |
| 4,193,095 | 3/1980 | Mizushima | 340/793 |
| 4,319,239 | 3/1982 | Stephens | 340/784 |
| 4,322,659 | 3/1982 | De Jule et al. | 315/169.1 |
| 4,339,482 | 7/1982 | Glaser et al. | 428/13 |
| 4,352,101 | 9/1982 | De Jule | 340/769 |
| 4,391,492 | 7/1983 | Lu et al. | 350/351 |
| 4,395,244 | 7/1983 | Glaser | 445/25 |
| 4,430,648 | 2/1984 | Togashi et al. | 340/784 |
| 4,550,039 | 10/1985 | Glaser et al. | 428/13 |
| 4,595,919 | 6/1986 | Holz et al. | 340/793 |

OTHER PUBLICATIONS

Scheffer, Terry J., "Direct-Multiplexed Liquid-Crystal Displays," *Seminar 4, SID 1987*, 4.1-4.34.

Howard, W. E., "Active-Matrix Techniques for Displays," *Proceedings of the SID*, vol. 27/4, 1986, 313-326.
Firester, Arthur H., "Active Matrices for Liquid-Crystal Displays," *Seminar 5, SID 1987*, 5.1-5.25.
Malmberg, Paul R., "Active Matrix Addressing Technology," *Seminar 3, SID 1985*, 3.2-2-3.2-28.
Dick, George W., "Plasma Display Panel Techniques," *Seminar 2, SID 1985*, 2.2-1-2.2-54.
Mikoshikba, Shigeo, "Plasma Displays," *Seminar 10, SID 1987*, 10.2-10.37.
Szydlo, N. et al., "Integrated Matrix-Addressed LCD Using Amorphous-Silicon Back-to-Back Diodes," *Proceedings of the SID*, vol. 25/4, 1984, 265-268.

*Primary Examiner*—Jeffery A. Brier
*Attorney, Agent, or Firm*—John D. Winkelman; Paul S. Angello

[57] ABSTRACT

An apparatus for and a method of addressing data storage elements (16) employs an ionizable gas to address the storage elements for storing data in and reading data out of them. The storage elements are defined by the overlapping areas of multiple column electrode (18) extending in a common direction on a first substrate (48) and multiple channels (20) extending in a common direction on a second substrate (54). A layer of dielectric material (46) separates the first and the second substrates, which are positioned face-to-face and spaced-apart with the direction of the channels transverse to that of the column electrodes. Each of the channels is filled with an ionizable gas and includes a reference potential electrode and a row electrode electrically isolated from each other. The ionizable gas functions as an electrical switch that changes between a conducting or plasma state and a nonconducting or nonionized state in response to an applied signal, and functions to either store data in or read data out of the storage elements.

46 Claims, 8 Drawing Sheets

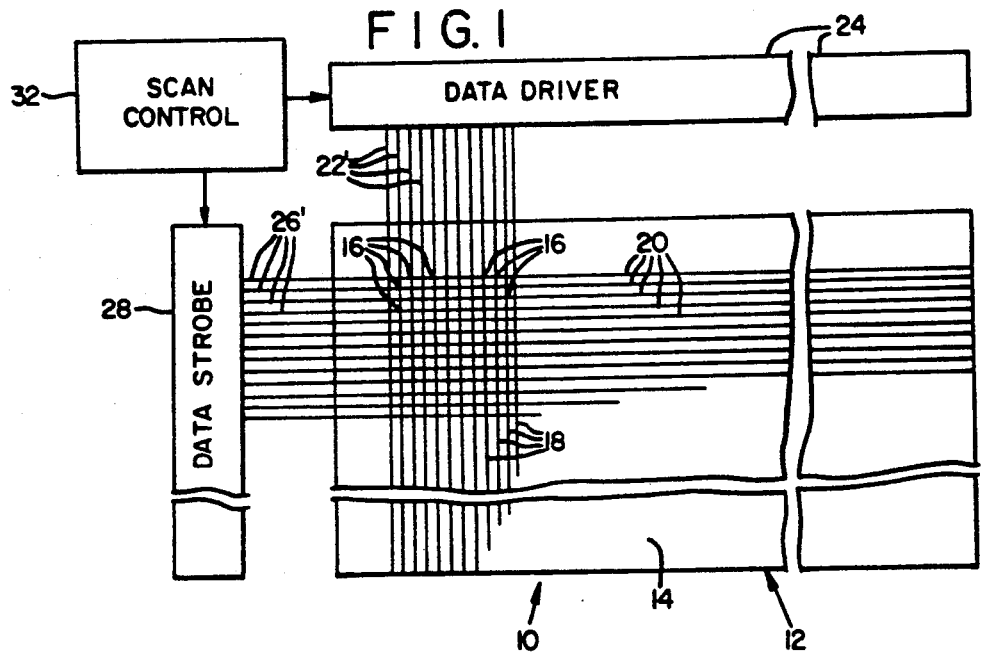
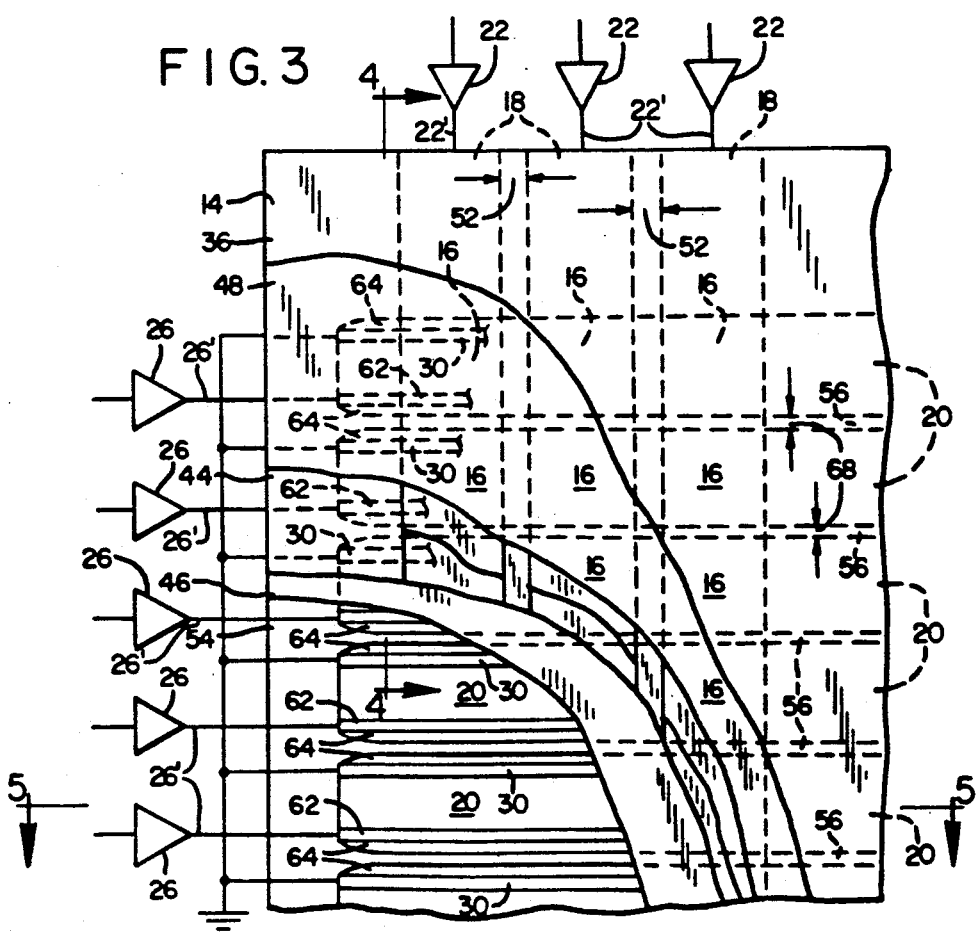

9 LINES WITH 9 DRIVERS

9 LINES WITH 6 DRIVERS

APPARATUS FOR AND METHODS OF ADDRESSING DATA STORAGE ELEMENTS

This is a continuation of application Ser. No. 07/145,061 filed Jan. 19, 1988 and now abandoned.

TECHNICAL FIELD

The present invention relates to systems constructed of data storage elements and, in particular, to apparatus for and methods of addressing an array of such storage elements with the use of an ionizable gas.

BACKGROUND OF THE INVENTION

Systems employing data storage elements include, for example, video cameras and image displays. Such systems employ an addressing structure that provides data to or retrieves data from the storage elements. One system of this type to which one embodiment of the present invention is particularly directed is a general purpose flat panel display, whose storage or display elements store light pattern data. A flat panel display comprises multiple display elements distributed throughout the viewing area of a display surface. A flat panel display system is desirable because it does not necessarily require a cathode-ray tube to develop a display image. A cathode-ray tube is undesirable because of its size, fragility, and need for high voltage drive circuitry.

One type of flat panel display system employs an addressing structure that accomplishes direct multiplexing of multiple liquid crystal cells or display elements arranged in an array. Each of the liquid crystal cells is positioned between a pair of electrical conductors that selectively apply select and deselect voltage signals across the liquid crystal cell to change its optical properties and thereby change the brightness of the image it develops. A display system of this type is characterized as "passive" because no "active" electronic device co-operates with the liquid crystal cell to modify its electro-optical properties. Such a display system suffers from the disadvantage of being capable of implementation with only a limited number of addressable lines (i.e., up to about 250) of video information or data for developing a display image.

One expedient for increasing the number of addressable lines of data in a liquid crystal display system entails the use of an addressing structure in which a separate electronic device cooperates with each liquid crystal cell to increase the effective nonlinearity of its electro-optic response to the select and deselect voltage signals. Some of what are referred to as "two-terminal" device addressing techniques can be characterized in this way. Although increasing the effective nonlinearity of a display element may allow greater multiplexing capabilities in a bilevel display, there remain many difficulties with this technique in respect to achieving gray scale performance.

The objective in designing liquid crystal matrix display systems having full gray scale capability is to provide an addressing structure that does not rely on obtaining the nonlinearity function from the liquid crystal material. An addressing structure that uses a matrix of electrically "active" elements accomplishes this objective by employing at each picture element an electronic switch that is separate from the liquid crystal material. The active matrix uses two- or three-terminal solid state devices in association with each liquid crystal cell to develop the needed nonlinearity and display element isolation. Addressing structures constructed of two-terminal devices can employ diodes of various types, and addressing structures constructed of three-terminal devices can employ thin film transistors (TFT) of various types manufactured from different semiconductor materials.

One problem with two- and three-terminal active matrices is that the very large number of active devices makes it very difficult to fabricate the matrix in large quantities with high production yields. Another problem, which is characteristic of TFT devices, is the difficulty of constructing thin film transistors with sufficiently high "off resistances." A relatively low "off resistance" provides a display element that may not hold the charge developed across it for the requisite time. A relatively low "off resistance" also decreases the "off resistance" to "on resistance" ratio, which preferably exceeds $10^6$ to promote proper operation of the TFT matrix. TFT matrices sometimes employ a separate storage capacitor with each display element to offset the effect of an insufficiently high "off resistance." The use of separate storage capacitors increases, however, the complexity of the TFT matrix incorporating them and the likelihood of decreased production yields. One other possible problem with a TFT active matrix is that the size of a TFT can be relatively large compared to that of the display element because "on" current requirements tend to increase the dimensions of a TFT device. This may affect the light efficiency of the device.

An active matrix formed of TFT devices is capable of developing black-and-white and colored images. To develop colored images, the active matrix employs a color filter containing multiple groups of spots in different colors spatially aligned with the display elements. A group of display elements aligned with spots of different colors would, therefore, define a single image pixel.

Flat panel display systems can also be implemented with display elements employing an ionizable gas or plasma that glows to produce on a display surface luminous regions whose color is characteristic of the type of gas used. The luminous regions are selectively activated to form a display image.

Another type of flat panel display system employs a plasma to generate electrons that are accelerated to strike a phosphor and produce a luminescent spot. Such a flat panel display provides increased efficiency in brightness but is difficult to produce with large display areas and requires complex drive circuits. Such flat panel displays can be constructed with multiple electron-excited phosphors having different spectral characteristics to provide multi-colored images.

Problems with gas-plasma flat panel displays are purportedly alleviated through the use of gas-discharge displays of the plasma-sac type. In such displays, a plasma-sac produced on the cathode side of an apertured insulator moves from one aperture to another to effect a raster-type scan. The plasma-sac-type gas-discharge displays are also complex to fabricate and are susceptible to low production yields.

SUMMARY OF THE INVENTION

An object of the present invention is, therefore, to provide a system employing data elements implemented as part of an addressing structure that can be produced at low cost with high production yields.

Another object of this invention is to provide a method that employs an ionizable gaseous medium to address a data storage element so that data can be read into or retrieved from it.

A further object of this invention is to provide a flat panel display system with high-speed addressing capabilities and high contrast characteristics and having storage or display elements comprised of an electro-optic material and an active addressing structure.

Still another object of this invention is to provide such a display system in which an electro-optic material cooperates with an ionizable gas to form addressable data storage elements.

Yet another object of this invention is to provide such a display system that has good color, gray scale, and brightness characteristics.

The present invention relates to an apparatus for and methods of addressing data elements. The invention is described herein only by way of example with reference to two embodiments.

The first embodiment comprises an addressing structure implemented in a high resolution flat panel display system that can be used in either direct view or projection applications. The display system includes a display panel having a display surface formed of an array of data storage or display elements distributed throughout the viewing area thereof. Each of the display elements comprises a localized volume of ionizable gas, such as helium, and an electro-optic material, such as a nematic liquid crystal, that cooperate to modulate externally generated light propagating through the region of the electro-optic material where the display element is located.

The second embodiment comprises an addressing structure implemented as part of a memory device into which and out of which analog information can be, respectively, electronically written or electronically read. The memory device includes an array of data storage or memory elements each of which includes a localized volume of ionizable gas, such as helium, and a dielectric material, such as glass, plastic, or photoconductor. The ionizable gas and dielectric material cooperate to provide a way of addressing the memory element to read out a signal previously developed across the memory element, irrespective of the manner in which it acquired the signal.

The storage elements are arranged in columns and rows for both embodiments. In the first embodiment, a row represents one line of video information or data, and in the second embodiment, a row represents a set of discrete quantities of analog information or data. (The information addressed in either embodiment is hereafter referred to as "data".) The columns receive the data, and a data strobe circuit addresses the columns row by row in a row scan fashion.

Either the display panel of the first embodiment or the memory device of the second embodiment comprises first and second spaced-apart substrates positioned face-to-face to each other. Multiple nonoverlapping electrical conductors extending generally in a first direction along the inner surface of the first substrate form column electrodes for data drive signals applied to them. Multiple nonoverlapping channels inscribed into the inner surface of the second substrate extend along the inner surface in a direction generally transverse to the first direction. The first and second directions preferably align with the vertical and horizontal directions, respectively. A reference potential electrode and a row electrode electrically isolated from each other extend along the length of the interior of each channel and receive data strobe signals applied between them. Each of the channels is filled with the ionizable gas.

In the display panel of the first embodiment, a layer of material having electro-optical properties and a layer of dielectric material are positioned between the inner surfaces of the first and second substrates, the layer of dielectric material covering the channels to form a barrier between the layer of the electro-optic material and the ionizable gas. The display elements are defined by the overlapping areas of the column electrodes and the channels and appear as spots on the display screen. The spots preferably are sufficiently small and positioned close to one another so that they are indistinguishable by an observer during normal viewing conditions.

The display panel is configured as described above so that for each display element, the ionizable gas functions as an electrical switch that changes between a conducting or plasma state and a nonconducting or nonionized state in response to an applied data strobe signal. The magnitude of the data drive signal on the column electrodes corresponds to the luminance of a display image.

Whenever it is in the conducting state, a region of ionized gas allows a data voltage of a magnitude representing that of a data drive signal to develop across the liquid crystal material in a region spatially aligned with the region of ionized gas. Whenever it changes to the nonconducting state, the region of nonionized gas allows the spatially aligned region of liquid crystal material to hold the data voltage across it for a time. The ionizable gas functions, therefore, to select and store data across the liquid crystal material and thereby provide a display system having gray scale capability.

Switching the ionizable gas between the conducting state and the nonconducting state in the display panel modulates the light transmission through a display element. The modulation of light transmission depends on the magnitude of the applied data drive signal. A monochrome or black-and-white display system with gray scale luminance qualities can be implemented with the use of the display panel. A full color display system with controllable color intensity can be implemented by positioning within the black-and-white display system a color filter containing groups of spots in three primary colors spatially aligned with the display elements A group of three display elements spatially aligned with a group of spots would, therefore, represent one image pixel whose color is determined by the relative intensities of the spots in the group.

The display system of the present invention is capable of rendering fully dynamic, gray scale images over a broad range of field rates to provide a quality display. The display system is especially advantageous because it is of simple, rugged construction and is capable of addressing at least 3,000 lines of data at 60 Hz field rates on the display screen.

In the memory device of the second embodiment, only a layer of dielectric material is positioned between the first and second substrates. The memory elements are defined by the overlapping areas of the column electrodes and the channels. The memory device is configured as described above so that for each memory element, the ionizable gas functions as an electrical switch that changes between the conducting state and the nonconducting state in response to the applied data strobe signal. Amplifiers providing the data drive signals are configured as column electrode drive amplifiers in a data write mode and as column electrode sensing amplifiers in a data read mode.

Whenever it is in the conducting state, a region of ionized gas allows a data voltage of a magnitude representing that of a data drive signal to develop across the dielectric material in a region spatially aligned with the region of ionized gas. This represents the data write mode of the memory device. Whenever it changes to the nonconducting state, the region of nonionized gas allows the spatially aligned dielectric material to hold the data voltage across it for a time. The column electrode sensing amplifier associated with the region applies a reference voltage to a surface of the layer of dielectric material opposite the surface spatially aligned with the region of ionized gas. Whenever it returns to the conducting state, the region of ionized gas causes a change in the voltage across the dielectric material which change is proportional to the previously written data voltage and appears at the output of the column electrode sensing amplifier. This represents the data read mode of the memory device.

Certain modifications of the addressing structure described above could facilitate other means for applying the data voltage to the memory elements of the memory device. For example, substituting a photoconductive material for the dielectric material and using column electrodes having optically transparent properties would permit incident light to modulate the magnitude of the data voltages applied to the memory element in proportion to the intensity of incident light. Such an addressing structure could be implemented as part of an image sensing device or optical processing device.

Additional objects and advantages of the present invention will be apparent from the detailed description of preferred embodiments thereof, which proceeds with reference to the accompanying drawings.

BRIEF DESCRIPTION OF THE DRAWINGS

FIG. 1 is a diagram showing a frontal view of the display surface of a display panel and associated drive circuitry of a display system embodying the present invention.

FIG. 3 is an enlarged fragmentary frontal view with portions broken away to show different depthwise views of the interior of the display panel of FIG. 2.

DETAILED DESCRIPTION OF PREFERRED EMBODIMENTS

Figure 2:
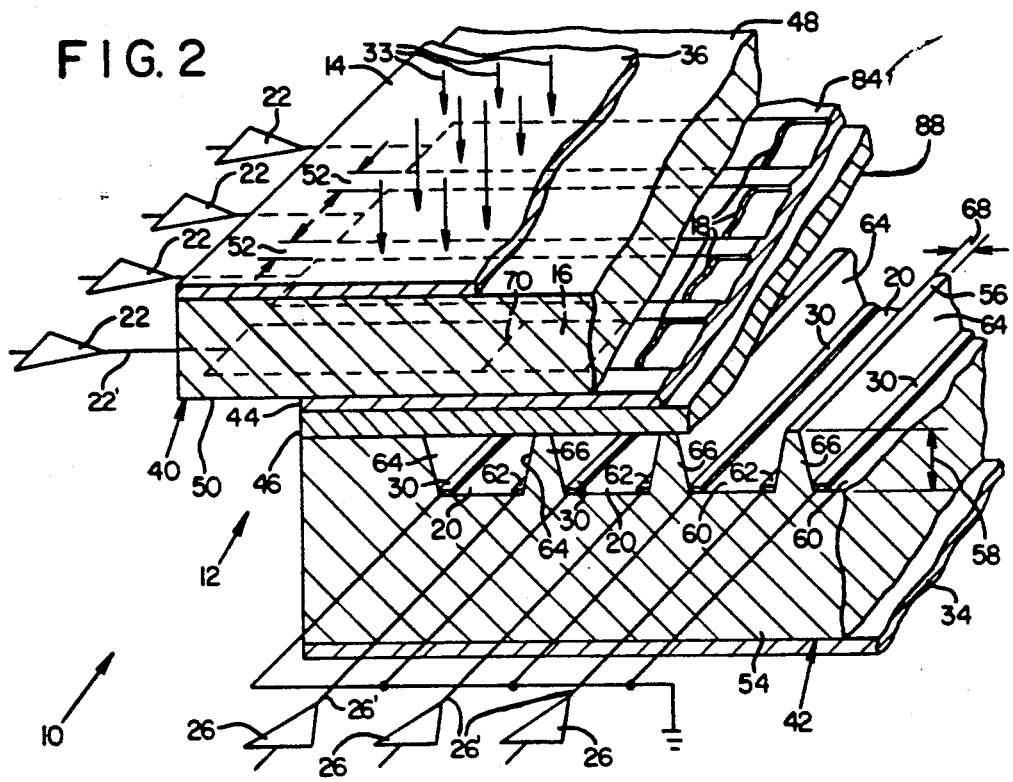
FIG. 2 is an enlarged fragmentary isometric view showing the layers of structural components forming the display panel embodying the present invention as viewed from the left side in FIG. 1.

FIG. 1 shows a flat panel display system 10, which represents a first embodiment that implements the addressing structure and carries out the addressing method of the present invention. With reference to FIG. 1, flat panel display system 10 comprises a display panel 12 having a display surface 14 that contains a pattern formed by a rectangular planar array of nominally identical data storage or display elements 16 mutually spaced apart by predetermined distances in the vertical and horizontal directions. Each display element 16 in the array represents the overlapping portions of thin, narrow electrodes 18 arranged in vertical columns and elongate, narrow channels 20 arranged in horizontal rows. (The electrodes 18 are hereinafter referred to as "column electrodes 18.") The display elements 16 in each of the rows of channels 20 represent one line of data.

The widths of column electrodes 18 and channels 20 determine the dimensions of display elements 16, which are of rectangular shape. Column electrodes 18 are deposited on a major surface of a first electrically nonconductive, optically transparent substrate, and channels 20 are inscribed in a major surface of a second electrically nonconductive, optically transparent substrate, as will be further described below. Skilled persons will appreciate that certain systems, such as a reflective display of either the direct view or projection type, would require that only one of the substrates be optically transparent.

Column electrodes 18 receive data drive signals of the analog voltage type developed on parallel output conductors 22, by different ones of the output amplifiers 22 (FIGS. 2-6) of a data driver or drive means or drive circuit 24, and channels 20 receive data strobe signals of the voltage pulse type developed on parallel output conductors 26' by different ones of the output amplifiers 26 (FIGS. 2-6) of a data strobe or strobe means or strobe circuit 28. Each of the channels 20 includes a reference electrode 30 (FIG. 2) to which a reference potential common to each channel 20 and data strobe 28 is applied.

To synthesize an image on the entire area of display surface 14, display system 10 employs a scan control circuit 32 that coordinates the functions of data driver 24 and data strobe 28 so that all columns of display elements 16 of display panel 12 are addressed row by row in row scan fashion. Display panel 12 may employ electro-optic materials of different types. For example, if it uses such a material that changes the polarization state of incident light rays 33, display panel 12 is positioned between a pair of light polarizing filters 34 and 36 (FIG. 2), which cooperate with display panel 12 to change the luminance of light propagating through them. The use of a scattering liquid crystal cell as the electro-optic material would not require the use of polarizing filters 34 and 36 however. A color filter (not shown) may be positioned within display panel 12 to develop multi-colored images of controllable color intensity. For a projection display, color can also be achieved by using three separate monochrome panels 10, each of which controls one primary color.

With reference to FIGS. 2-5, display panel 12 comprises an addressing structure that includes a pair of generally parallel electrode structures 40 and 42 spaced apart by a layer 44 of electro-optic material, such as a nematic liquid crystal, and a thin layer 46 of a dielectric material, such as glass, mica, or plastic. Electrode structure 40 comprises a glass dielectric substrate 48 that has deposited on its inner surface 50 column electrodes 18 of indium tin oxide, which is optically transparent, to form a striped pattern. Adjacent pairs of column electrodes 18 are spaced apart from each other by a distance 52, which defines the horizontal space between next adjacent display elements 16 in a row.

Figure 11A:
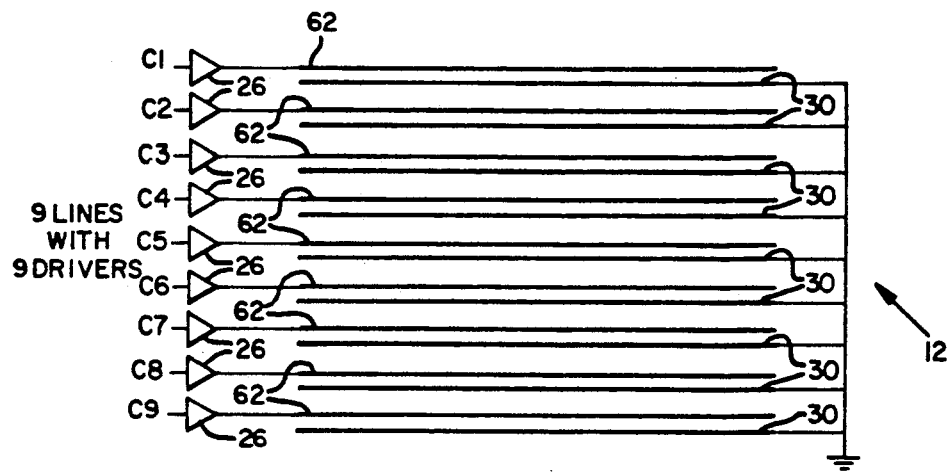
FIGS. 11A and 11B are diagrams of alternative channel electrode wiring configurations that illustrate a technique for reducing the required number of outputs of the data strobe of FIG. 1.

Electrode structure 42 comprises a glass dielectric substrate 54 into whose inner surface 56 multiple channels 20 of trapezoidal cross section are inscribed. Channels 20 have a depth 58 measured from inner surface 56 to a base portion 60. Each one of the channels 20 has a pair of thin, narrow nickel electrodes 30 and 62 extending along base portion 60 and a pair of inner side walls 64 diverging apart in the direction away from base portion 60 toward inner surface 56. The reference electrodes 30 of the channels 20 are connected to a common electrical reference potential, which can be fixed at ground potential as shown. The electrodes 62 of the channels 20 are connected to different ones of the output amplifiers 26 (of which three and five are shown in FIG. 2 and FIG. 3, respectively) of data strobe 28. (The electrodes 62 are hereinafter referred to as "row electrodes 62.") To ensure proper operation of the addressing structure, the reference electrodes 30 and row electrodes 62 preferably are connected to the electrical reference potentials and the outputs 26' of data strobe 28, respectively, on opposite sides of display panel 10, as best shown in FIG. 11A.

The sidewalls 64 between adjacent channels 20 define a plurality of support structures 66 whose top surfaces 56 support layer 46 of the dielectric material. Adjacent channels 20 are spaced apart by the width 68 of the top portion of each support structure 66, which width 68 defines the vertical space between next adjacent display elements 16 in a column. The overlapping regions 70 of column electrodes 18 and channels 20 define the dimensions of display elements 16, which are shown in dashed in FIGS. 2 and 3. FIG. 3 shows with better clarity the array of display elements 16 and the vertical and horizontal spacings between them.

The magnitude of the voltage applied to column electrodes 18 specifies the distance 52 to promote isolation of adjacent column electrodes 18. Distance 52 is typically much less than the width of column electrodes 18. The inclinations of the side walls 64 between adjacent channels 20 specify the distance 68, which is typically much less than the width of channels 20. The widths of the column electrodes 18 and the channels 20 are typically the same and are a function of the desired image resolution, which is specified by the display application. It is desirable to make distances 52 and 68 as small as possible In current models of display panel 12, the channel depth 58 is one-half the channel width.

Each of the channels 20 is filled with an ionizable gas, preferably one that includes helium, for reasons that will be explained below Layer 46 of dielectric material functions as an isolating barrier between the ionizable gas contained within channel 20 and layer 44 of the liquid crystal material The absence of dielectric layer 46 would permit either the liquid crystal material to flow into the channel 20 or the ionizable gas to contaminate the liquid crystal material Dielectric layer 46 may be eliminated from displays that employ a solid or encapsulated electro-optic material, however.

Figure 6:
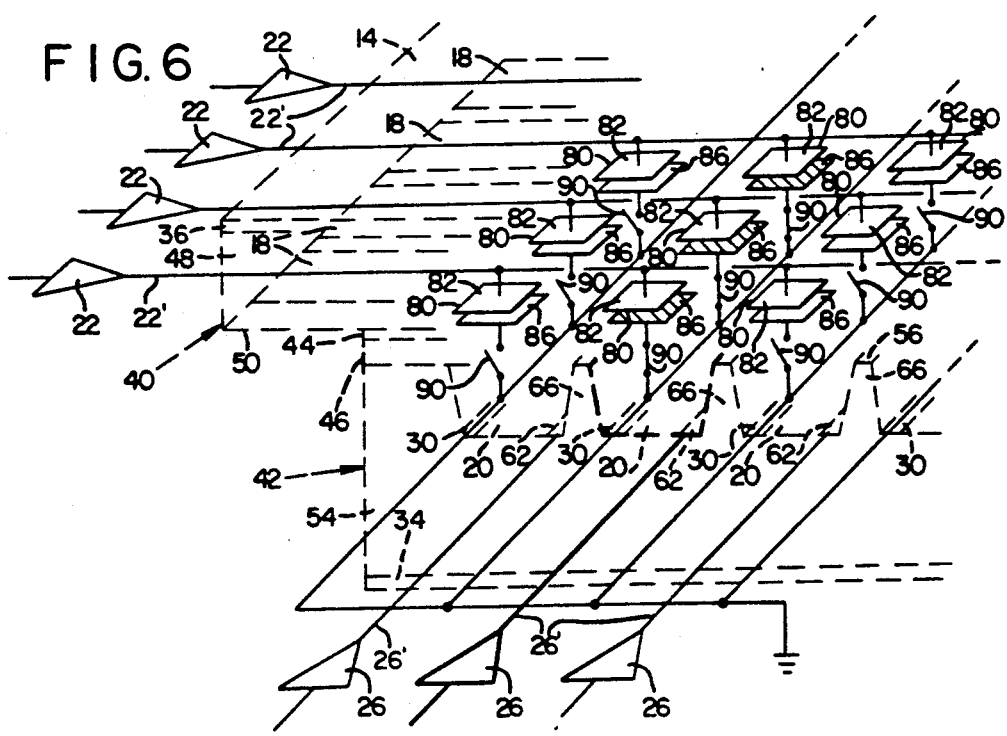
FIG. 6 is an equivalent circuit showing for a display system the operation of the plasma as a switch for an exemplary row receiving a data strobe pulse and three exemplary data columns receiving a data drive signal.
Figure 5:
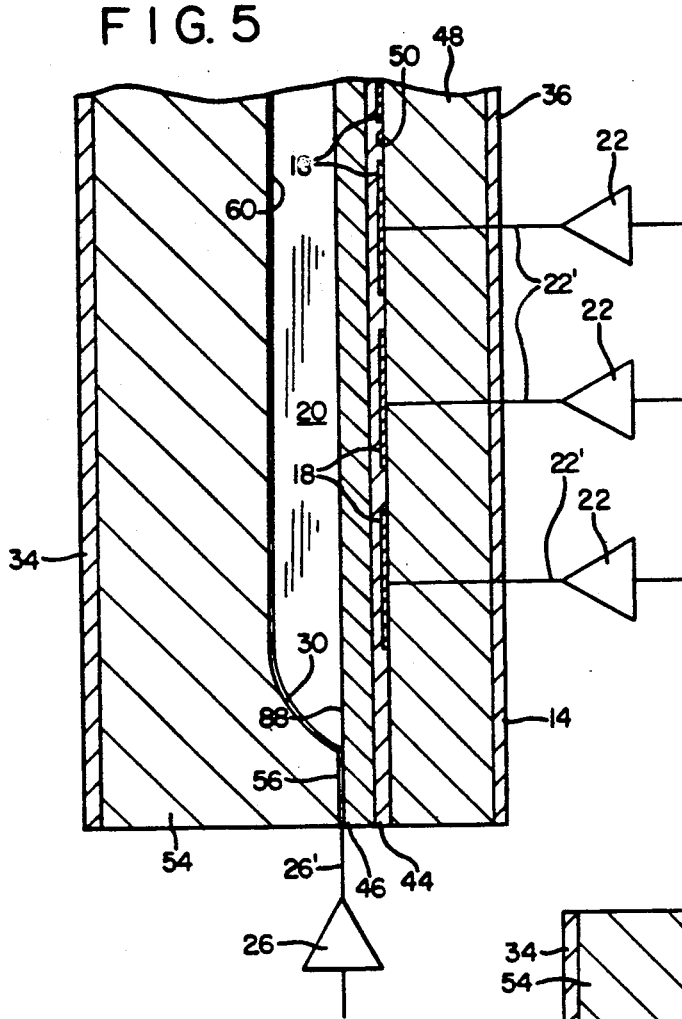
FIG. 5 is an enlarged sectional view taken along lines 5—5 of FIG. 3.
Figure 4:
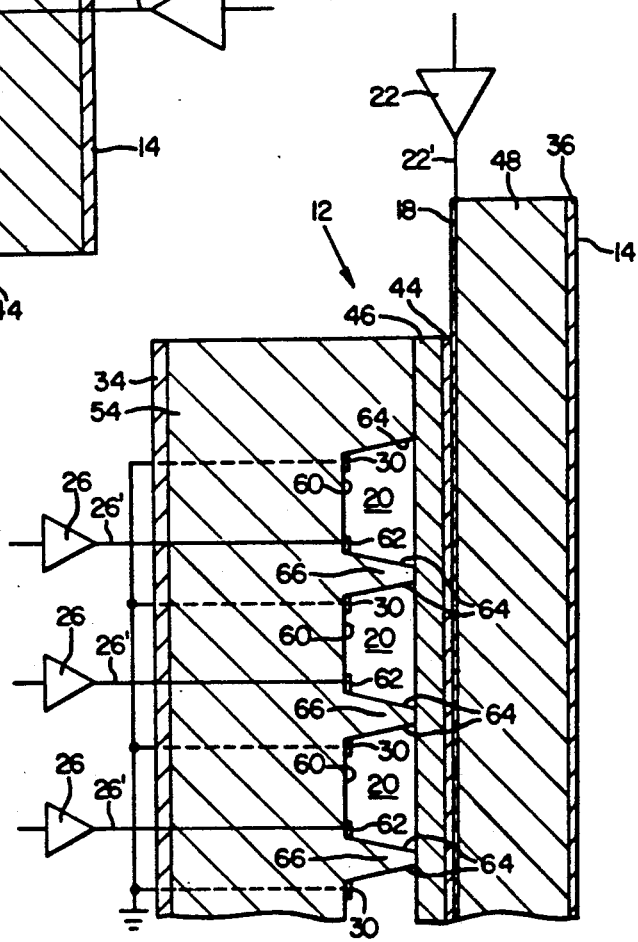
FIG. 4 is an enlarged sectional view taken along lines 4—4 of FIG. 3.

The principles underlying the operation of display panel 12 are that 1) each of its display elements 16 functions as a sampling capacitor for analog voltage data applied to the column electrode 18 forming a part of the display element and 2) the ionizable gas functions as a sampling switch. FIG. 6 is an equivalent circuit to which the following explanation of the operation of display system 10 refers.

With reference to FIG. 6, each of display elements 16 of display panel 12 can be modeled as a capacitor 80 (hereinafter "capacitor model 80"), whose top plate 82 represents one of the column electrodes 18 (FIG. 2) and whose bottom plate 86 represents the free surface 88 (FIG. 2) of layer 46 of the dielectric material Capacitor model 80 represents the capacitive liquid crystal cell formed by an overlapping region of a column electrode 18 and a channel 20. The description herein of the operation of display system 10 refers to the capacitor model 80.

In accordance with the basic addressing procedure, data driver 24 captures a first line of data, which represents discrete samples of the time-varying voltage of an analog data signal in a time interval of predetermined duration The sample of the magnitude of the data signal at a particular instance within the time interval represents the magnitude of the analog voltage applied to a capacitor model 80 in a corresponding column position of the row electrode 62 receiving a strobe pulse. Data driver 24 develops on its output conductors 22 the analog voltages that are applied to column electrodes 18. In FIG. 6, four exemplary output amplifiers 22 of data driver 24 deliver analog voltages of positive polarity with respect to reference electrode 30 to the respective ones of column electrodes 18 to which they are connected. The application of a positive voltage on a column electrode 18 induces on free surface 88 (FIG. 2) of layer 46 of the dielectric material a voltage that is essentially equal to the magnitude of the applied voltage. This causes no change in the potential difference across capacitor model 80 and is represented in FIG. 6 by a top plate 82 and a bottom plate 86 with white surfaces In this instance, the gas contained in a channel 20 is in a nonionized state, and the analog voltage developed on plates 82 and 86 of capacitor model 80 is positive with respect to the voltage potential of reference electrode 30 in the channel. Whenever data strobe 28 develops a negative-going voltage pulse on the row electrode 62 positioned within a channel 20, the gas in the channel assumes an ionized state (i.e., becomes a plasma). The channel 20 whose row electrode receives the strobe pulse is represented in FIG. 6 in dark, thick lines. Under these conditions, the grounded reference electrode 30 and the strobed row electrode 62 function as an anode and a cathode, respectively, for the plasma contained within the channel.

The electrons in the plasma neutralize the induced positive voltage on the bottom plates 86 of capacitor models 80. The capacitor models 80 in the strobed row are charged with the data voltages applied across them. This condition is indicated in FIG. 6 by top plates 82 with white surfaces and bottom plates 86 with lined surfaces. Upon completion of the storage of the data voltages across capacitor models 80, data strobe 28 terminates the negative-going voltage pulse on the row electrode 62 of the strobed channel 20, thereby ending the strobe pulse and extinguishing the plasma.

Each of the row electrodes 62 is strobed in a similar manner until the entire display surface 14 is completely addressed and thereby stores an image field of data. The voltage remains stored across each of the capacitor models 80 in the strobed row for a time at least as long as the duration of the image field and is independent of subsequent changes in data voltage applied to top plate 82 of capacitor model 80. The voltage stored across each of the capacitor models 80 changes in accordance with the analog data voltages representing the display data of the next succeeding image field.

In a display system 10 whose image fields are in a noninterlaced format, the analog data voltages applied to column electrodes 18 in the next succeeding image field are of opposite polarity. Alternating between positive and negative polarities from one image field to the next image field provides a long term zero net DC voltage component, which is typically required for long term operation of liquid crystal materials. The liquid crystal material produces the gray scale effect in response to the root-mean-square (rms) value of the applied analog voltage data. The display image produced is, therefore, unaffected by alternate changes in polarity of the analog voltage data. In a display system 10 whose image fields are in an interlaced format, the analog data voltages applied to column 18 electrodes in next succeeding image frames are of opposite polarity to achieve the long term zero net DC voltage component. Each image frame includes two image fields of which each comprises one-half the number of addressable lines.

The description presented above indicates that the ionizable gas contained within each of the channels 20 operates as an electrical switch 90 whose contact position changes between binary switching states as a function of the voltage applied by data strobe 28. The switches 90 shown in FIG. 6 in the open position are connected to reference electrodes 30 and are driven by a strobe pulse applied to row electrodes 62. The absence of a strobe pulse allows the gas within the channels 20 to be in a nonionized state and thereby be in a nonconducting state. The switches 90 shown in FIG. 6 in the closed position are connected to a reference electrode 30 and are driven by a strobe pulse that is applied to row electrode 64 and is of a magnitude that causes the gas within the channel 20 to be in an ionized state and thereby be in a conducting state. In FIG. 6, the amplifier 26 shown in the middle of the three output amplifiers 26 of data strobe 28 strobes a row of capacitor models 80 to establish and store the display data voltages across them.

To function as a switch, the ionizable gas contained within channels 20 beneath electrode structure 40 communicates with layer 46 of the dielectric material to provide an electrically conductive path from layer 46 of the dielectric material to reference electrode 30. The plasma in a channel 20 whose row electrode 62 receives a strobe pulse provides a ground path to the capacitor model 80 representing the portion of liquid crystal material positioned adjacent the plasma. This allows the capacitor models 80 to sample the analog data voltages applied to column electrodes 18 Extinguishing the plasma acts to remove the conducting path, thereby allowing the data sample to be held across the display element The voltages remain stored across layer 44 of the liquid crystal material until voltages representing a new line of data in a subsequent image field are developed across the layer 44. The abovedescribed addressing structure and technique provide signals of essentially 100% duty cycle to every one of the display elements 16.

Figure 7:
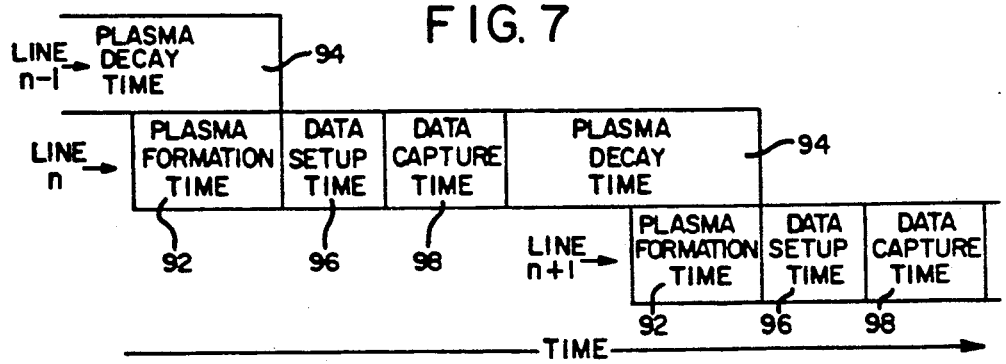
FIG. 7 is a diagram showing the various time constraints that determine the maximum number of lines of data that are addressable by a display system embodying the present invention.

FIG. 7 is a diagram showing the time constraints that limit the number of lines of data of which display system 10 is capable of addressing during an image field. With reference to FIG. 7, an exemplary line "n" of data requires time 92 for the plasma to form after the row of electrodes 62 of the strobed channel 20 receives a strobe pulse. The plasma formation time 92 may be substantially eliminated as a factor in limiting the number of addressable lines in an image field by initiating the strobe pulse in advance during the preceding line n31 1. In the preferred embodiment, the plasma formation time 92 for helium gas is nominally 1.0 microsecond.

The data setup time 96 represents the time during which data driver 24 slews between the data values of two next adjacent lines of data and develops on output amplifiers 22 the analog voltage signals that are applied to column electrodes 18. The data setup time 96 is a function of the electronic circuitry used to implement data driver 24. A data setup time 96 of less than 1.0 microsecond is achievable.

Figure 8:
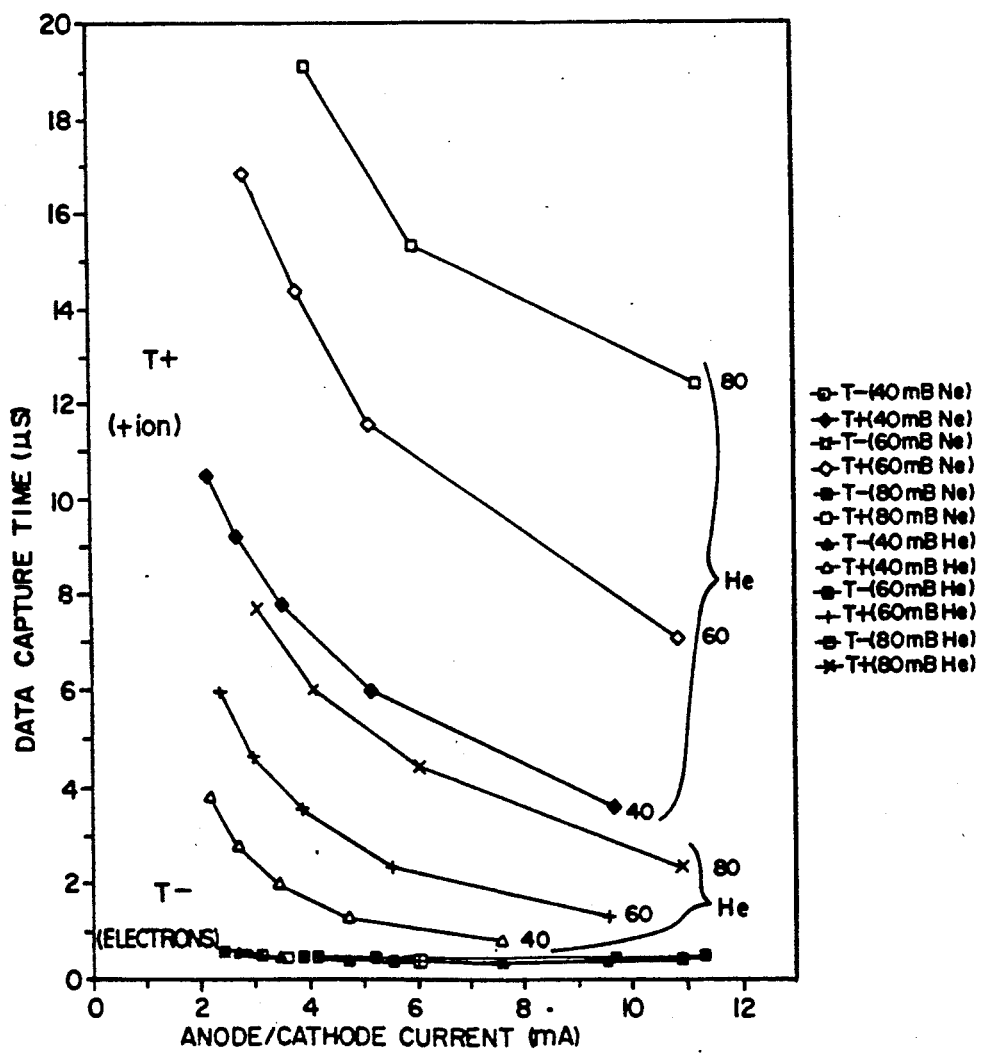
FIG. 8 is a graph showing the comparative relationship of the data capture times of neon gas and helium gas as a function of the current flowing between the electrodes positioned within the channels of the display panel of FIGS. 2-5.

The data capture time 98 depends on the conductivity of the ionizable gas contained within the channels 20. FIG. 8 is a graph showing the time for data capture 98 as a function of the plasma current flowing between reference electrode 30 and row electrode 62 in a channel 20. The curves in FIG. 8 represent the time required by a display element to acquire 90% of the voltage corresponding to a datum. FIG. 8 shows that the ions produced by a plasma comprised of helium gas exhibit a lower data capture time 98 than that of neon. The electron current in a plasma flows from the cathode (row electrode 62) to the anode (reference electrode 30).

A preferred operating point is that which provides the fastest data capture time 98 for positive ion current. In the particular case represented in FIG. 8, such an operating point can be achieved by using helium gas at a pressure of 40 millibars and a current of 7.5 milliamperes to produce a time 98 for data capture of about 0.5 microsecond. The reason helium provides a shorter data capture time 98 than that of neon is that helium is a lighter ion with greater mobility Optimum values of pressure and current depend on the size and shape of channels 20.

Figure 9:
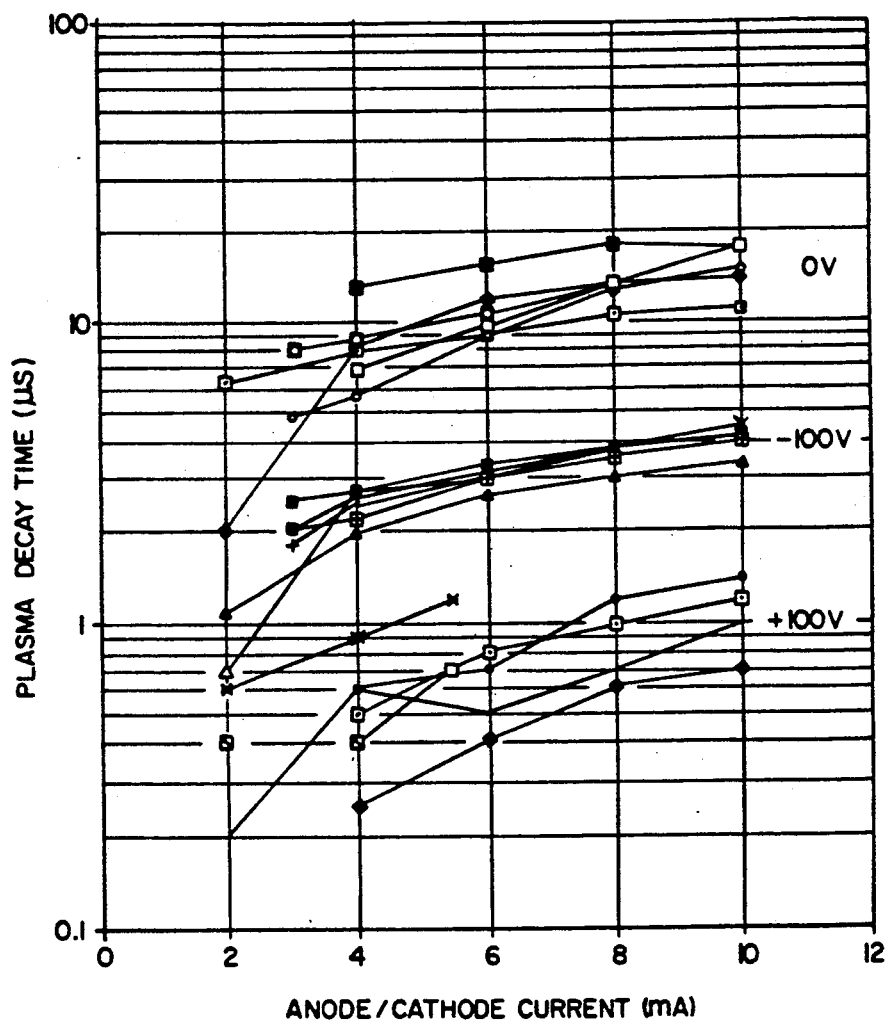
FIG. 9 is a graph showing for data strobe pulses of different magnitudes the plasma decay times for helium gas as a function of the current that was flowing during the strobe pulse between the electrodes positioned within the channels of the display panel of FIGS. 2-5.

The plasma decay time 94 represents the time during which the plasma in channel 20 returns to a deionized state upon the removal of a strobe pulse from row electrode 62. FIG. 9 is a graph showing the plasma decay time beyond which no greater than 3% crosstalk will occur as a function of anode/cathode current in display panel 12. FIG. 9 shows that the plasma decay time 94 increases as a function of the current flowing through the plasma from row electrode 62 to reference electrode 30. The magnitude of the strobe pulse applied to row conductor 62 determines the amount of current flowing through the plasma. FIG. 9 indicates that decreased plasma decay times 94 can be achieved by applying a continuous bias voltage of about +100 volts, which is less than the voltage required to maintain the helium gas in its ionized state. FIG. 9 also indicates that a bias voltage of +100 volts would provide approximately a tenfold decrease in plasma decay time 94 relative to a bias voltage of zero volts.

The time required to address a line of data equals the sum of the data setup time 96, the data capture time 98, and the plasma decay time 94. The number of lines addressable during an image field equals the time duration of the image field divided by the time required to address a line of data. For noninterlaced 60 Hz frame rate applications, the number of lines of data display system 10 would appear to be capable of addressing exceeds 9,000 lines using the above-described simple addressing technique. It will be appreciated that the number of addressable lines of data is not the same as the resolution of display system 10. The resolution is a function of the widths of the channels 20 and the widths of the column electrodes 18.

The use of a priming technique is advantageous to ensure the ability to address a relatively large number of lines in an image frame. Priming entails the introduction of ions to initiate a gas discharge. Priming of display system 10 can be accomplished by passing a current through a priming channel (not shown) which is orthogonally disposed to the channels 20 and in which each of the channels 20 terminates along one of the margins of display panel 12. Priming allows plasma formation without an initial statistical delay time that would otherwise unpredictably lengthen the plasma formation time.

Figure 10A:
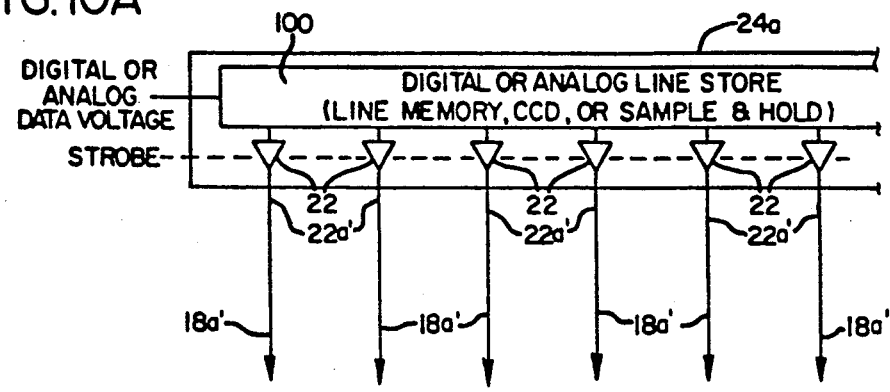
FIGS. 10A and 10B are diagrams of alternative electronic circuit designs of the data driver shown in FIG. 1.
Figure 10B:
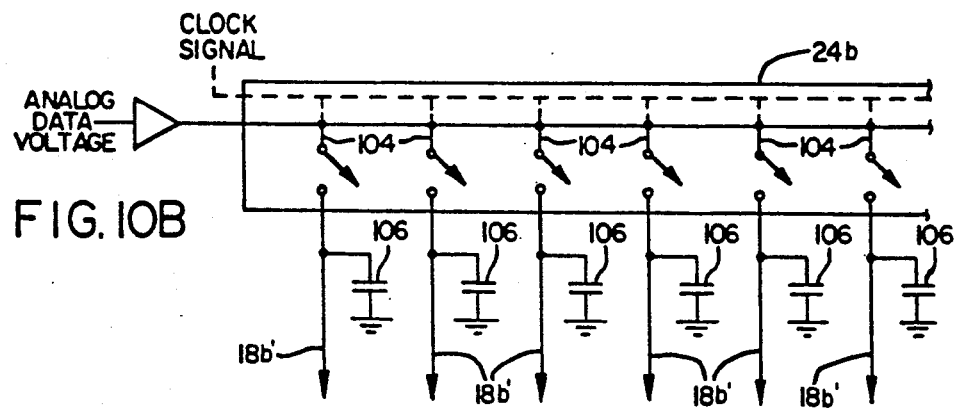

FIGS. 10A and 10B show alternative circuit designs for the data drivers 24 whose corresponding components are identified by identical reference numerals with the suffixes "a" and "b", respectively.

With reference to FIG. 10A, data driver 24a samples the data signal and stores it in a buffer memory or line store 100. The data signal can be in analog or digital form. Buffer memory 100 can be of the charge-coupled device (CCD) type or the sample-and-hold type to store an analog data signal, or buffer memory 100 can be of the digital type to store a digital data signal. The devices 22 represent either buffer amplifiers or digital-to-analog converters, depending on whether buffer memory 100 holds analog voltages or digital data, respectively. Devices 22 permit the parallel transfer of analog voltages to column electrodes 18a. Data driver 24a is capable of high-speed operation because CCD and sample-and-hold circuits are capable of high-speed acquisition and the analog voltages can be transferred simultaneously in parallel to the column electrodes 18a.

With reference to FIG. 10B, data driver 24b samples the analog data signal in serial fashion by sequentially closing and opening one at a time different ones of a set of switches 104. Each of the switches 104 is connected to a corresponding capacitor 106. The capacitors 106 accumulate charge from the data signal when the switch is closed. This provides analog lo voltage samples of the data signal to the column electrodes 18b in a row from one end to the other end. A sampling clock signal applied to the control electrodes of switches 104 sets the sampling rate. The data setup time 96 of the circuit of FIG. 10B is greater than that of the circuit of FIG. 10A by a multiplication factor equal to the number of column electrodes 18b.

To operate properly in display system 10, data driver 24b requires that the horizontal blanking time from row to row exceed the sum of the data capture time 98 and the plasma decay time 94.

Figure 11B:
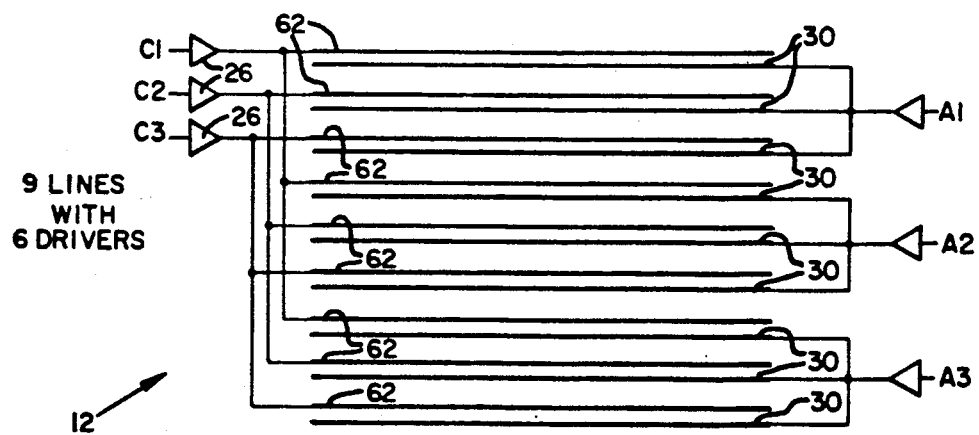

FIGS. 11A and 11B compare the number of data strobe outputs required for exemplary display panels 12 having nine channels whose reference electrodes 30 receive, respectively, a fixed reference voltage and strobe signal pulses The display panel 12 of FIG. 10A has its reference electrodes 30 connected to ground and nine different strobe output amplifiers 26, data strobe 28 driving different ones of row electrodes 62. The display panel 12 of FIG. 11B has its reference electrodes 30 grouped in first sets of three and its row electrodes 62 grouped in second sets of three. The channels 20 (FIG. 4) whose reference electrodes 30 together form any one of the first sets include no greater than one electrode 62 of any one of the second sets. Display system 10 strobes only one set of the first sets of reference electrodes 30 for a time interval of predetermined duration. During the strobe time interval, display system 10 addresses the display elements 16 by driving the column electrodes 18 and strobing the second set of row electrodes 62 included within the channels 20 whose reference electrodes 30 receive the strobe pulse. The row electrodes 62 of the channels 20 whose reference electrodes 30 do not receive a strobe pulse are, therefore, not activated.

This configuration of electrical connections of the output amplifiers 26 of data strobe 28 to the reference electrodes 30 and row electrodes 62 of channels 20 provides an addressing structure that requires fewer outputs 26 of the data strobe 28. In the exemplary display panel 12 of FIG. 11B, the number of data strobe output amplifiers 26 is reduced from nine to six.

Figure 12:
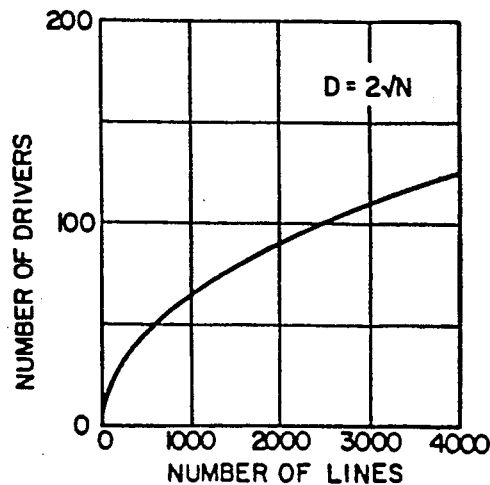
FIG. 12 is a graph showing the minimum number of drivers required as a function of the available number of addressable lines of data for a channel electrode wiring configuration of the type shown in FIG. 11B.

FIG. 12 is a graph showing the minimum number of drivers required as a function of the number of addressable lines of data available with an addressing structure of the type implemented in the display panel 12 of FIG. 11B. FIG. 12 indicates that substantial reduction of drivers can be achieved for display systems having a relatively large number of addressable lines of data.

The addressing structure of the present invention is also amenable to the reduction of the number of drivers through the use of other techniques similar to the technique implemented in the Self-Scan TM displays developed by Burroughs. Such displays employ a display cell, which the viewer sees, and a scan cell, which the viewer does not see. The scan cells control the state of the display cells by sending active priming particles into a localized region of an ionizable gas. In a scan cell channel, a plasma discharge is moved sequentially adjacent each display cell and generates priming particles which activate the display cell adjacent to them.

In display panel 12, electrical segmentation of the orthogonal priming channel could provide a localized ion source that moves sequentially from one channel to the next. In lieu of the above-described technique, wall charge coupling or other known techniques could be employed to implement further driver reduction.

The addressing technique of applying data voltages of positive and negative polarities in alternate image fields is amenable to implementation in a display system 10 employing the driver reduction technique described with reference to FIGS. 11B and 12. Alternative addressing techniques that apply data voltages of only positive polarity can further increase the addressing speed. These alternative techniques introduce an erase field upon the conclusion of each image field.

In one addressing technique of this type, during the erase field, data driver 24 applies a voltage of about ground potential to column electrodes 18 as data strobe 28 applies sequentially a positive pulse and a negative pulse of relatively short durations to row electrodes 62 of the channels 20. During application of the positive pulse, reference electrode 30 and row electrode 62 function as a cathode and an anode, respectively, of the plasma. Since the previously required data voltages were of positive polarity, any charge stored across a storage element 16 induces a negative charge on surface 88 of layer 46 of the dielectric material, which functions, therefore, as a cathode. A cathode is surrounded by a relatively large ion density, which rapidly neutralizes the negative charge on layer 46 of the dielectric material. The voltage on layer 46 may approach that of the anode and, therefore, can accumulate residual positive charge to a significant degree. During application of the negative pulse, the ground potential applied to column electrodes 18 resets the residual positive charge to ground in a manner similar to that effected during the writing of an image field.

If the positive pulse is not used, the speed of addressability is limited by the above-described positive ion charging phenomenon. This alternative addressing technique is not, however, amenable to the exact driver reduction techniques described with reference to FIGS. 11B and 12.

In another addressing technique of this type, data strobe 28 applies a negative pulse to more than one (e.g., ten) row electrodes 62 to erase more than one line of data at a time. This technique would cause duty cycle nonuniformities of a small degree across display surface 14 of display panel 12.

Flat panel display system 10 can be modified to form a versatile analog data memory system 110 containing an array of memory elements, which represents a second embodiment that implements the addressing structure and carries out the method of the present invention. Such modifications include the removal of polarizing filters 34 and 36, if they are present, and layer 44 of electro-optic material shown in FIGS. 2, 4, and 5.

Figure 13:
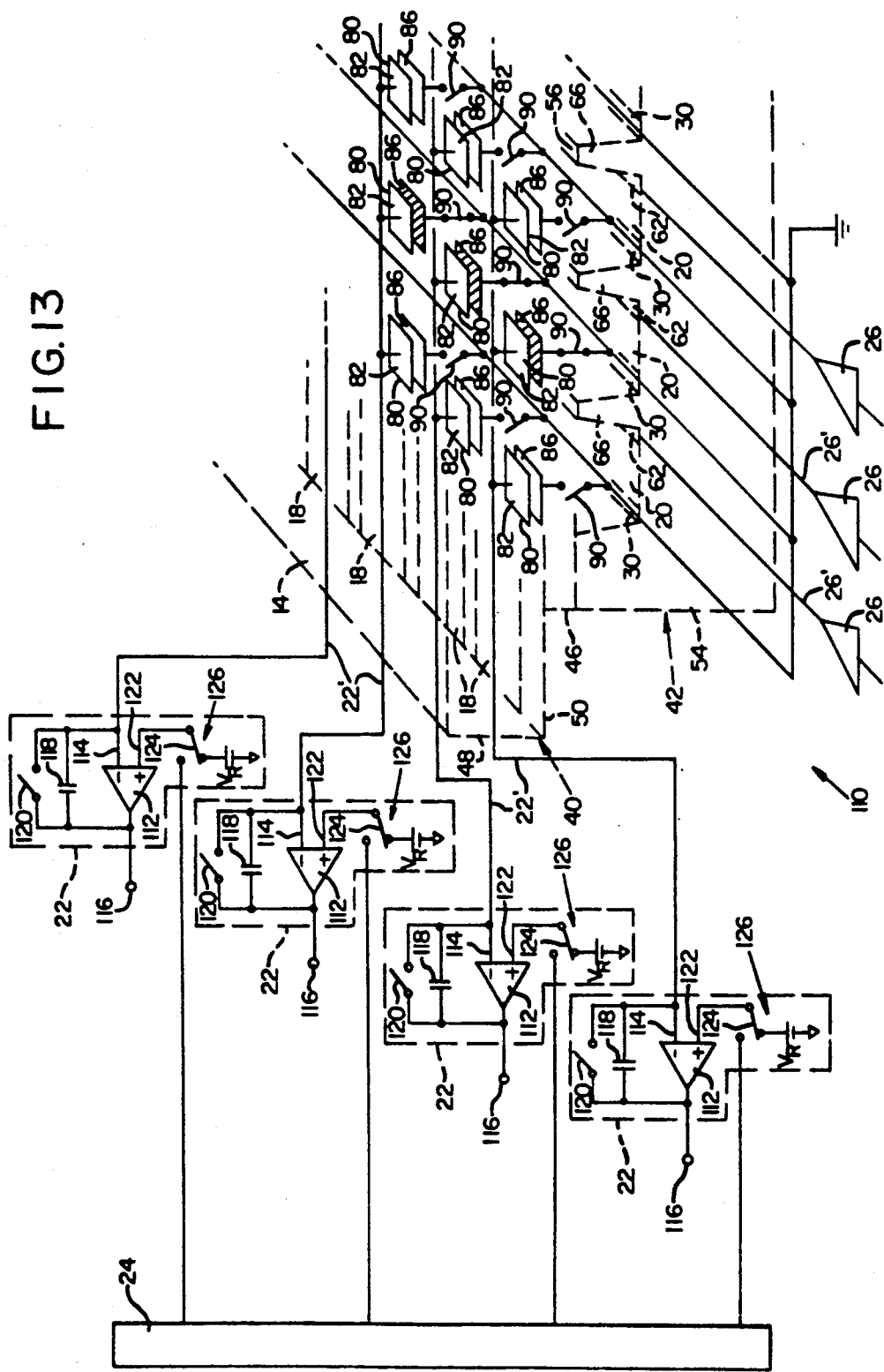
FIG. 13 is an equivalent circuit showing the operation of the plasma as a switch in cooperation with the data drive circuit to form an addressing structure for selectively writing data into and reading data out of a memory element.

FIG. 13 shows the equivalent circuit for memory system 110. Except as indicated above, the systems of FIGS. 6 and 13 are similar; therefore, corresponding components in FIGS. 6 and 13 bear identical reference numerals. In memory system 110, dielectric 46 functions as the dielectric element of capacitor model 80, which represents a memory element. It will be appreciated that column electrodes 18 need not be formed of optically transparent material and may advantageously be formed of aluminum or other conductive material. The data drive output amplifiers 22 of memory system 110 comprise circuit elements that function as column electrode drive amplifiers in the data write mode and as column electrode sensing amplifiers in the data read mode. The data strobe output amplifiers 26 of the systems of FIGS. 6 and 13 are similar.

With reference to FIG. 13, each of the output amplifiers 22 of data drive circuit 24 comprises a high-speed operational amplifier 112 that has connected between its inverting input terminal 114 and output terminal 116 a parallel combination including a feedback capacitor 118 and a switch element 120. Amplifier 112 is selectively configured as a voltage follower in the data write mode by actuating switch element 120 to its conducting state and as an integrator in the data read mode by actuating switch element 120 to its nonconducting state. The noninverting input terminal 122 of operational amplifier 112 is connected to the moveable contact terminal 124 of a switch element 126, which selectively connects noninverting input terminal 122 to either a reference voltage $V_R$ or an output signal conductor of data drive circuit 24.

Whenever it is in the data write mode, output amplifier 22 delivers a data drive signal to the column electrode 18 forming a memory element of memory system 110. This is accomplished by configuring operational amplifier 112 as a voltage follower and positioning moveable contact terminal 124 of switch element 126 to deliver the data drive signal from data drive circuit 24 to noninverting input terminal 122 of operational amplifier 112. During this time, a row strobe pulse applied to row electrode 62 in the channel 20 forming the memory element 110 excites the ionizable gas contained in the channel to the ionized state, thereby developing a data voltage across capacitor model 80 in the manner as described above with reference to FIG. 6. The magnitude of the voltage across capacitor model 80 represents that of the data drive signal.

Whenever it is in the data read mode, data amplifier 22 senses the current in the column electrode 18 forming the memory element of memory system 110. This is accomplished by means of a two-step process.

First, moveable contact terminal 124 of switch element 126 is positioned to deliver voltage reference $V_R$ to noninverting input terminal 122 of operational amplifier 112. During this time, the row strobe pulse is inactive to maintain the ionizable gas in a nonionized state, thereby allowing the reference voltage $V_R$ to be established on output terminal 116 of operational amplifier 112, column electrode 18, and upper plate 82 of capacitor model 80. The voltage across feedback capacitor 118 is thereby normalized to 0.0 volts. It will be appreciated, however, that memory system 110 can be configured to operate with an offset voltage between the inputs and outputs of each operational amplifier 112.

Second, after the voltage across feedback capacitor 118 stabilizes to 0.0 volts, operational amplifier 112 is configured as an integrator whose input terminal 114 is prepared to receive the current flowing from column electrode 18. The voltage difference between lower plate 86 of capacitor model 80 and reference electrode 30 is a function of $V_R$ and the previously written data voltage across capacitor model 80. Whenever a row strobe pulse again excites the ionizable gas to its ionized state, lower plate 86 of capacitor model 80 is electrically connected to reference electrode 30, thereby changing the voltage across capacitor model 80. Operational amplifier 112 now configured as an integrator senses this change in voltage and provides on its output terminal 116 a voltage proportional to the data voltage previously developed across capacitor model 80.

There exist other alternatives for developing the data voltage cross capacitor model 80 to promote its function as a memory element. For example, substituting photoconductive material for the dielectric material of layer 46, using optically transparent column electrodes 18, and exposing memory system 110 to visible light would modulate the voltages across capacitor models 80 in proportion to the intensity of the light incident on memory system 110. The voltage change developed across capacitor model 80 in response to the intensity of incident light would be restored during the data read mode, as described above. The layer 46 of photoconductive material and optically transparent column electrodes 18 provide, therefore, an image sensing device with analog data memory properties.

In the above-described image sensing device, the construction of layer 46 of photoconductive material as multiple electrically isolated strips or discrete islands would avoid conduction between adjacent capacitor models 80. Constructing a strip of metal or other conductive material along the margin of the optically transparent electrodes would increase efficiency of data collection in the data read mode by decreasing the time required to read out the data voltage developed across capacitor models 80.

The above-described image sensing device uses the photoconductive properties of layer 46 of photoconductive material during the period between the data read modes. It is also possible to make direct use of the photoconductive properties of layer 46, in which case the storage element 16 might be more properly characterized as a "sensing" element and capacitor model 80 would be more properly depicted as an electrical current modulating device. This can be accomplished by applying to column electrode 18 a voltage that establishes a voltage gradient across layer 46 during the time a row strobe pulse is applied between strobe electrode 62 and reference electrode 30. The electrical current flowing from reference electrode 30, through layer 46 and column electrode 18, to output terminal 116 of operational amplifier 112 would constitute the output signal. Replacing feedback capacitor 118 with a resistor would make the voltage appearing on output terminal 116 of operational amplifier 112 proportional to the current flowing through layer 46.

It will be obvious to those having ordinary skill in the art that many changes may be made to the details of the above-described preferred embodiment of the present invention without departing from the underlying principles thereof. The scope of the present invention should be determined, therefore, only by the following claims.

I claim:

1. In an addressable electro-optic system having multiple light pattern data storage elements comprised of an electro-optic material and arranged in an array on a surface, the storage elements being electrically responsive to data drive and data strobe circuits that provide respective data drive and data strobe signals to form an image on the surface at the location of the storage element, a switching element for selecting and storing data across the electro-optic material at the location of an element, comprising:
   an enclosed volume containing an ionizable gaseous medium, the ionizable gaseous medium cooperating with the electro-optic material and being responsive to the data strobe signal to effect a change in a property of the electro-optic material, whereby the data strobe signal places the ionizable gaseous medium in an ionized state to develop across the storage element a potential difference corresponding to the magnitude of the data drive signal to effect the change.

2. The system of claim 1 in which the data drive circuit comprises a first electrode positioned adjacent a first surface of the electro-optic material and the data strobe circuit comprises second and third spaced-apart electrodes positioned within the enclosed volume, the first and second electrodes receiving the data drive and data strobe signals, respectively, and the third electrode being connected to an electrical reference potential.

3. The system of claim 2 in which a dielectric material is positioned between a second surface of the electro-optic material and the ionizable gaseous medium.

4. The system of claim 1 in which the electro-optic material is of the liquid crystal type.

5. The system of claim 1 in which the ionizable gaseous medium comprises helium.

6. The system of claim 1 in which a dielectric material is positioned to isolate the electro-optic material from the ionizable gaseous medium.

7. An addressable electro-optic system having multiple light pattern data storage elements, comprising:
   a first substrate supporting on a major surface thereof plural nonoverlapping first electrodes that extend in a first direction;
   a second substrate having plural nonoverlapping channels that extend along a major surface thereof in a second direction, each of the channels containing an ionizable gas and having one of plural second electrodes extending along a substantial portion of the length of the channel,
   the first and second substrates being disposed face-to-face and spaced-apart with the first direction transverse to the second direction to define overlapping regions of the first electrodes and the channels;
   a layer of material having electro-optical properties positioned between the first and second substrates, the layer of electro-optic material and the overlapping regions defining plural light pattern data storage elements; and
   first means for applying first electrical signals to the first electrodes and second means for applying second electrical signals to the second electrodes, the simultaneous application of the first and second electrical signals to selected ones of the first and second electrodes effecting ionization of the gas associated with the storage element defined by the selected ones of the first and second electrodes and changing a property of the electro-optic material in response to the first electrical signal.

8. The system of claim 7 in which the ionizable gas includes helium.

9. The system of claim 8 in which the layer of electro-optic material is of the liquid crystal type.

10. The system of claim 9 in which the liquid crystal material is of the nematic type.

11. The system of claim 7 in which each of the channels defines a row of the storage elements and each of the first electrodes defines a column of the storage elements, and which further comprises means for coordinating the functions of the first and second means for applying the respective first and second electrical signals so that the second means applies the second electrical signal to the second electrode of a row of storage elements during the time when the first means applies the first electrical signals to the columns of storage elements, thereby to change a property of the electro-optic material of the storage elements in a row in response to the first electrical signal.

12. The system of claim 7 in which the first and second means provide in each of successive first and second image fields the simultaneous application of the first and second electrical signals only once to each of the storage elements, the first electrical signals of the first image field being of opposite polarity to that of the second image field.

13. The system of claim 7 in which a layer of dielectric material is positioned to isolate the electro-optic material from the ionizable gas.

14. An addressable electro-optic display device, comprising a first substrate supporting on a major surface thereof plural first electrical conductors that extend along the surface in a common direction;
   a second substrate having plural channels that extend along a major surface thereof in a common direction, each channel containing an ionizable gas and having one of plural second electrical conductors extending along a substantial portion of its length;
   the first and second substrates being disposed face-to-face and spaced-apart with the direction of the channels transverse to that of the first conductors;
   a layer of material having electro-optical properties disposed between the first and second substrates;
   first means for applying a first electrical signal to a selected one of the first conductors, and
   second means for applying a second electrical signal to a selected one of the second conductors,
   the simultaneous application of the first and second electrical signals to the selected first and second conductors effecting ionization of the gas in a defined region of the channel associated with the selected second conductor, thereby producing a change in a property of the electro-optic material in a region thereof adjacent the selected channel.

15. A method of addressing a storage element for optical data, the storage element including a layer of materials having electro-optic properties, comprising:
   inducing on a first major surface of the layer a signal corresponding to the optical data; and
   effecting ionization of an ionizable gaseous medium in communication with the layer by developing an electrical conduction path through the ionizable gaseous medium to an electrical reference to effect storage of the signal by the storage element and thereby change a property of the layer of electro-optic material in accordance with the optical data.

16. The method of claim 15 in which the ionizable gaseous medium is positioned to electrically communicate with a second major surface of the layer to develop the electrical conduction path from the second major surface to the electrical reference.

17. The method of claim 15, further comprising positioning a layer of dielectric material between a second major surface of the layer of electro-optic material and the ionizable gaseous medium to develop the electrical conduction path between the layer of dielectric material and the electrical reference, thereby to isolate the layer of electro-optic material from the ionizable gaseous medium.

18. The method of claim 17 in which the layer of electro-optic material is of the liquid crystal type.

19. The method of claim 15, further comprising positioning the storage element to receive incident light propagating from a light source and thereby change the transmissivity of the incident light by an amount corresponding to the optical data.

20. The method of claim 15, further comprising effecting de-ionization of the ionizable gaseous medium to maintain for a time the property previously made by the change.

21. The method of claim 20 in which the deionization is effected by applying between the electrical reference and an electrode communicating with the ionizable gaseous medium a signal of a character that causes deionization of the ionizable gaseous medium and electric current flow between the electrode and the electrical reference, thereby to reduce the decay time of the ionizable gaseous medium from ionization to de-ionization.

22. The method of claim 15, further comprising positioning a color filter in optical association with the storage element to receive incident light propagating from a light source and thereby impart a color value to the incident light of an amount corresponding to the optical data.

23. A method of applying a variable value electrical potential representing a datum to a data storage element, comprising:
   providing an interruptible electrical connection between a variable value electrical potential source and the data storage element by selectively effecting ionization of an ionizable gaseous medium in communication with the data storage element, the ionization of the gaseous medium producing light emission characterized by an intensity and developing an electrical conduction path through the gaseous medium to complete the electrical connection to the potential source and thereby apply a variable value potential representing a datum to the data storage element, the value of the electrical potential applied to the data storage element being independent of the intensity of the light emission produced.

24. The method of claim 23 in which the data storage element includes a layer of dielectric material, and which further comprises the step of inducing on a major surface of the dielectric layer a variable value electrical signal corresponding to a datum, thereby to address the data storage element and to effect storage of the signal by the data storage element.

25. The method of claim 23 in which the data storage element includes a layer of material having electro-optical properties, and which further comprises the step of inducing on a major surface of the layer of electro-optical material a variable value electrical signal corresponding to a datum, thereby to address the data storage element and to change a property of the layer of electro-optical material in response to the signal.

26. The method of claim 25 in which the layer of material having electro-optical properties comprises a liquid crystal.

27. An addressing structure for an analog data storage element, comprising:
   an ionizable gaseous medium in communication with an analog data storage element and an electrical reference; and
   ionizing means for selectively effecting ionization of the ionizable gaseous medium to produce light emission characterized by an intensity and thereby provide an interruptible electrical connection between the data storage element and the electrical reference, thereby to selectively address and apply an analog datum to the analog data storage element, the analog datum having a value that is independent of the intensity of the light emission produced.

28. The addressing structure of claim 27 in which the data storage element comprises a data electrode for transmitting variable value data signals and a layer of dielectric material having first and second major surfaces, the first major surface communicating with the data electrode and the second major surface communicating with the ionizable gaseous medium.

29. The addressing structure of claim 28 in which a layer of material having electro-optic properties is disposed between the data electrode and the first major surface of the layer of dielectric material so that a property of the layer of electro-optic material changes in response to a data signal appearing on the data electrode.

30. A method of changing a property of light incident to a data storage element to which an electrical potential representing a datum is applied, comprising:

providing an interruptible electrical connection between a variable value electrical potential source and the data storage element by selectively effecting ionization of an ionizable gaseous medium in communication with the data storage element, the ionization of the gaseous medium developing an electrical conduction path through the gaseous medium to complete the electrical connection to the potential source and thereby apply a variable value potential representing a datum to the data storage element; and changing a property of the incident light by causing it to propagate within the data storage element, the change in the property corresponding to the value of the electrical potential applied to the data storage element.

31. The method of claim 30 in which the data storage element includes a layer of material having nonluminescent electro-optical properties, and which further comprises the step of inducing on a major surface of the layer a variable value electrical signal corresponding to a datum, thereby to address the data storage element and to change a property of the layer of electro-optic material and effect a consequent change to the property of the light in response to the signal.

32. The method of claim 31 in which the layer nonluminescent electro-optic material is of the liquid crystal type.

33. The method of claim 30 in which light propagates within and exits the data storage element in which a light polarizing filter is positioned in optical communication with the data storage element to modulate the intensity of the light exiting the data storage element.

34. The method of claim 30, further comprising the step of interrupting the electrical connection between the variable value electrical potential source and the data storage element while sustaining the property of light corresponding to the value of the electrical potential applied to the data storage element.

35. The method of claim 30 in which the property of the light corresponds to its polarization state.

36. A method of applying a variable value electrical potential representing a datum to, and storing the datum in, a data storage element, comprising:

providing an interruptible electrical connection between a variable value electrical potential source and the data storage element by selectively effecting ionization of an ionizable gaseous medium in communication with the data storage element, the ionization of the gaseous medium developing an electrical conduction path through the gaseous medium to complete the electrical connection to the potential source and thereby apply a variable value potential representing a datum to the data storage element;

interrupting the electrical connection between the variable value electrical potential source and the data storage element to electrically disconnect the potential source from the data storage element; and sustaining the value of the electrical potential applied to the data storage element to store the datum therein.

37. The method of claim 36 in which the data storage element includes a layer of electro-optic material, and which further comprises the step of inducing on a major surface of the layer a variable value electrical signal corresponding to a datum, thereby to address the data storage element and to change a property of the layer of electro-optic material in response to the signal.

38. The method of claim 37 in which the layer of electro-optic material is of the nonluminescent type.

39. The method of claim 37 in which the layer of electro-optic material is of the liquid crystal type.

40. The method of claim 39 in which light from an external source propagates within and exits the data storage element and in which a light polarizing filter is positioned in optical communication with the data storage element to modulate the intensity of the light exiting the data storage element.

41. The method of claim 37 in which the property of the light corresponds to the polarization state.

42. An addressing structure for a data storage element to which an electrical potential representing a datum is applied to change a property of light incident thereto, comprising:

ionizing means for providing an interruptible electrical connection between a variable value electrical potential source and the data storage element by selectively effecting ionization of an ionizable gaseous medium in communication with the data storage element, the ionization of the gaseous medium developing an electrical conduction path through the gaseous medium to complete the electrical connection to the potential source and thereby apply a variable value potential representing a datum to the data storage element; and means for changing a property of the incident light by causing it to propagate within the data storage element, the change in the property corresponding to the value of the electrical potential applied to the data storage element.

43. The addressing structure of claim 42 in which the data storage element includes a layer of material having nonluminescent electro-optical properties, and in which the application of the electrical potential induces on a major surface of the layer a variable value electrical signal corresponding to the datum, thereby to address the data storage element and to change a property of the layer of electro-optic material and effect a consequent change in the property of the light in response to the signal.

44. The addressing structure of claim 43 in which the layer of nonluminescent electro-optic material is of the liquid crystal type.

45. The addressing structure of claim 42 in which light propagates within and exits the data storage element and in which a light polarizing filter is positioned in optical communication with the data storage element to modulate the intensity of the light exiting the data storage element.

46. The addressing structure of claim 42 in which the property of the light corresponds to its polarization state.

* * * * *

UNITED STATES PATENT AND TRADEMARK OFFICE
CERTIFICATE OF CORRECTION

PATENT NO. : 5,077,553

DATED : December 31, 1991

INVENTOR(S) : Thomas S. Buzak

It is certified that error appears in the above-identified patent and that said Letters Patent is hereby corrected as shown below:

Col. 17, line 26, "of the" should be "of said".

Col. 17, line 34, "materials" should be "material".

Col. 19, line 39, "layer nonluminescent" should be "layer of nonluminescent".

Col. 19, line 43, "element in" should be "element and in".

Signed and Sealed this

Sixth Day of April, 1993

Attest:

STEPHEN G. KUNIN

*Attesting Officer*   Acting Commissioner of Patents and Trademarks